(12) United States Patent
Jang et al.

(10) Patent No.: US 11,081,603 B2
(45) Date of Patent: Aug. 3, 2021

(54) ORGANIC SOLAR CELL AND MANUFACTURING METHOD THEREFOR

(71) Applicant: LG CHEM, LTD., Seoul (KR)

(72) Inventors: Songrim Jang, Daejeon (KR); Younshin Kim, Daejeon (KR); Jaechol Lee, Daejeon (KR); Doowhan Choi, Daejeon (KR); Jiyoung Lee, Daejeon (KR); Jinseck Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 15/736,216

(22) PCT Filed: Dec. 5, 2016

(86) PCT No.: PCT/KR2016/014183
§ 371 (c)(1),
(2) Date: Dec. 13, 2017

(87) PCT Pub. No.: WO2017/099441
PCT Pub. Date: Jun. 15, 2017

(65) Prior Publication Data
US 2018/0175219 A1 Jun. 21, 2018

(30) Foreign Application Priority Data

Dec. 7, 2015 (KR) .................. 10-2015-0173537
Dec. 2, 2016 (KR) .................. 10-2016-0163556

(51) Int. Cl.
*H01L 51/42* (2006.01)
*H01L 31/0256* (2006.01)
(Continued)

(52) U.S. Cl.
CPC ........ *H01L 31/0256* (2013.01); *H01L 31/043* (2014.12); *H01L 31/06* (2013.01);
(Continued)

(58) Field of Classification Search
CPC . H01L 51/42; H01L 51/0036; H01L 51/0047; H01L 51/0068; H01L 51/0094;
(Continued)

(56) References Cited

U.S. PATENT DOCUMENTS 8,816,035 B2 * 8/2014 Leclerc ............... H01L 51/0043
528/25
2006/0130895 A1 6/2006 Gaudiana et al.
(Continued)

FOREIGN PATENT DOCUMENTS

CN 2733597 10/2005
EP 1672653 6/2006
(Continued)

OTHER PUBLICATIONS

Kim et al, Thieno[3,2-b]thiophene-Substituted Benzodithiophene in Donor-Acceptor Type Semiconducting Copolymers: A Feasible Approach to Improve Performances of Organic Photovoltaic Cells (Year: 2014).*

(Continued)

*Primary Examiner* — Uyen M Tran
(74) *Attorney, Agent, or Firm* — Myers Bigel, P.A

(57) ABSTRACT

The present application relates to an organic solar cell including: a first electrode; a second electrode which is disposed to face the first electrode; and an organic material layer having one or more layers which includes a photoactive layer disposed between the first electrode and the second electrode, in which one or more layers of the organic material layer include two or more regions having different thicknesses.

14 Claims, 6 Drawing Sheets

(51) Int. Cl.
*H01L 31/20* (2006.01)
*H01L 31/043* (2014.01)
*H01L 31/06* (2012.01)
*H01L 51/00* (2006.01)

(52) U.S. Cl.
CPC ............ *H01L 31/206* (2013.01); *H01L 51/42* (2013.01); *H01L 51/4253* (2013.01); *H01L 51/0036* (2013.01); *H01L 51/0043* (2013.01); *H01L 51/0047* (2013.01); *H01L 51/0068* (2013.01); *H01L 51/0094* (2013.01); *H01L 2031/0344* (2013.01); *Y02E 10/549* (2013.01); *Y02P 70/50* (2015.11)

(58) Field of Classification Search
CPC ... H01L 31/0256; H01L 31/043; H01L 31/06; H01L 31/206; Y02E 10/549
See application file for complete search history.

(56) References Cited

U.S. PATENT DOCUMENTS

| | | | |
|---|---|---|---|
| 2006/0145365 A1 | 7/2006 | Halls et al. | |
| 2009/0194167 A1* | 8/2009 | Brabec | B82Y 10/00 136/261 |
| 2009/0199896 A1 | 8/2009 | Fujimaki et al. | |
| 2012/0067395 A1* | 3/2012 | Beaujuge | H01L 27/301 136/244 |
| 2012/0085412 A1 | 4/2012 | Lee et al. | |
| 2013/0048059 A1* | 2/2013 | Han | B82Y 10/00 136/252 |
| 2013/0269766 A1 | 10/2013 | Park et al. | |
| 2014/0116511 A1* | 5/2014 | Lee | H01L 51/0032 136/263 |
| 2014/0217329 A1* | 8/2014 | Hayoz | C09B 69/109 252/500 |

FOREIGN PATENT DOCUMENTS

| | | | |
|---|---|---|---|
| JP | 2006179488 | 7/2006 | |
| JP | 2013222750 | 10/2013 | |
| KR | 20100019728 | 2/2010 | |
| KR | 10-2010-0115848 | 10/2010 | |
| KR | 10-0989285 | 10/2010 | |
| KR | 1020100132787 | 12/2010 | |
| KR | 10-2012-0037316 | 4/2012 | |
| KR | 20140114712 | * 9/2014 | ............ H01L 51/00 |

OTHER PUBLICATIONS

Lee et al, "Semiccrystalline D-A Copolymers with Different Chain Curvature for Applications in Polymer Optoelectronic Devices" (Year: 2014).*
Extended European Search Report corresponding to EP16783306.1 (dated Jun. 25, 2019) (7 pages).
Lee et al. "Colored, see-through perovskite solar cells employing an optical cavity" Journal of Materials Chemistry C3:5377-5382 (2015).
Ameri et al. "Fabrication, Optical Modeling, and Color Characterization of Semitransparent Bulk-Heterojunction Organic Solar Cells in an Inverted Structure" Advanced Functional Materials 20:1592-1598 (2010).
Tang, C.W., "Two-layer organic photovoltaic cell" Appl. Phys. Lett., 48, 183-185 (1986).
Yu, G et al., "Polymer photovoltaic cells: Efficiencies via Network of Internal Donor-Acceptor Heterojunctions", Science, 270.5243. 1789-1791 (1995).

* cited by examiner

[Figure 1]
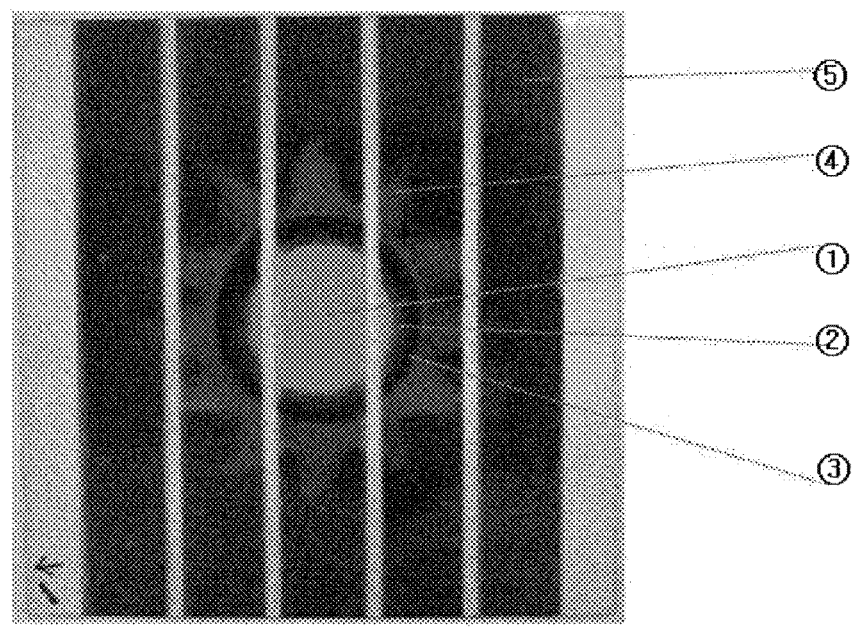
[Figure 2]
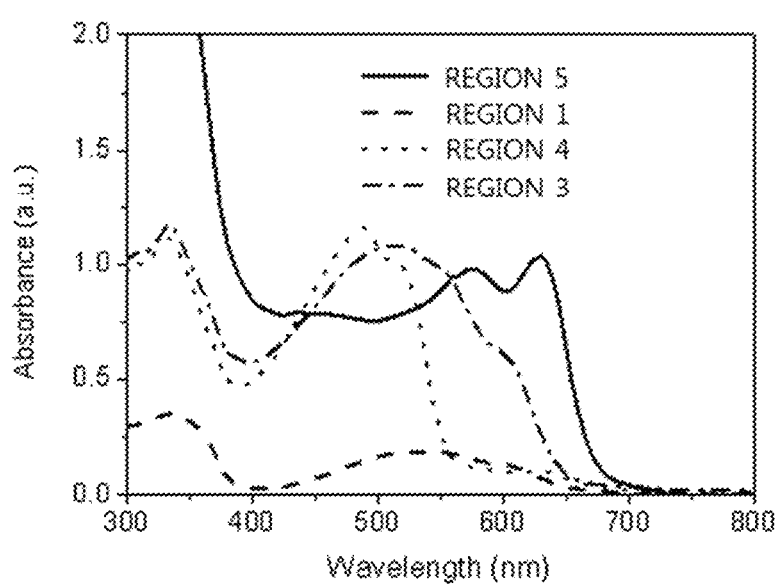

[Figure 3]
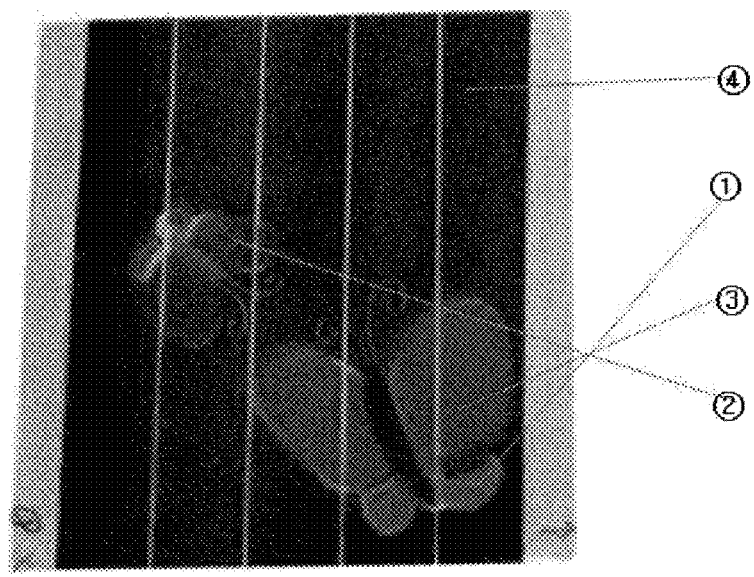
[Figure 4]
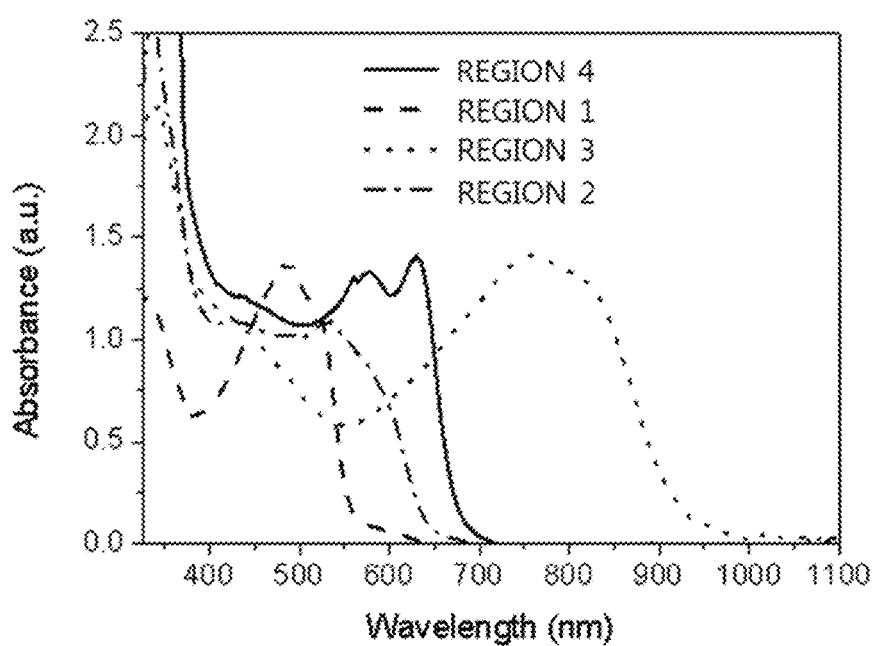

[Figure 5]
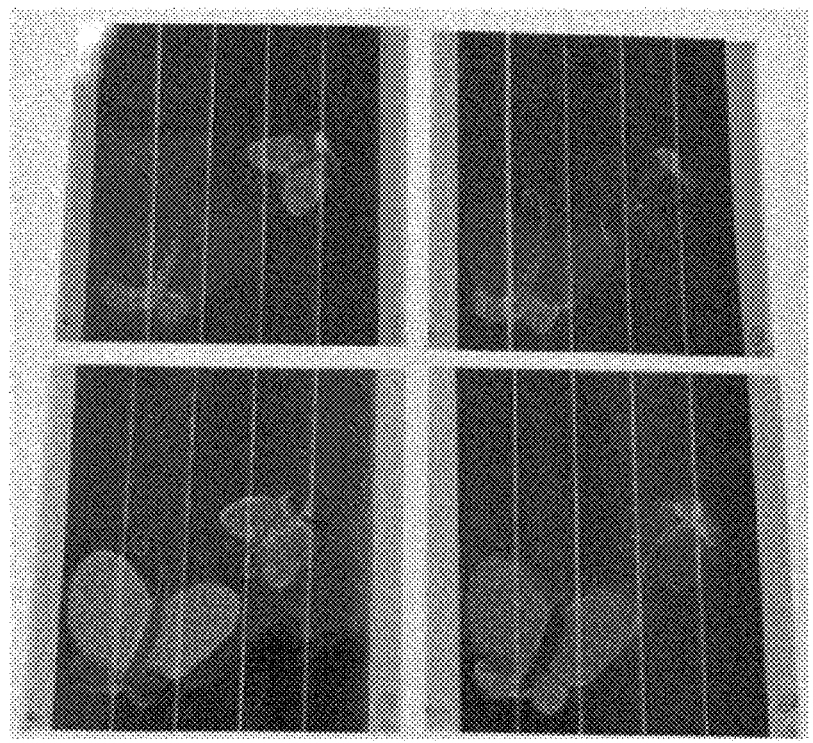

[Figure 6]
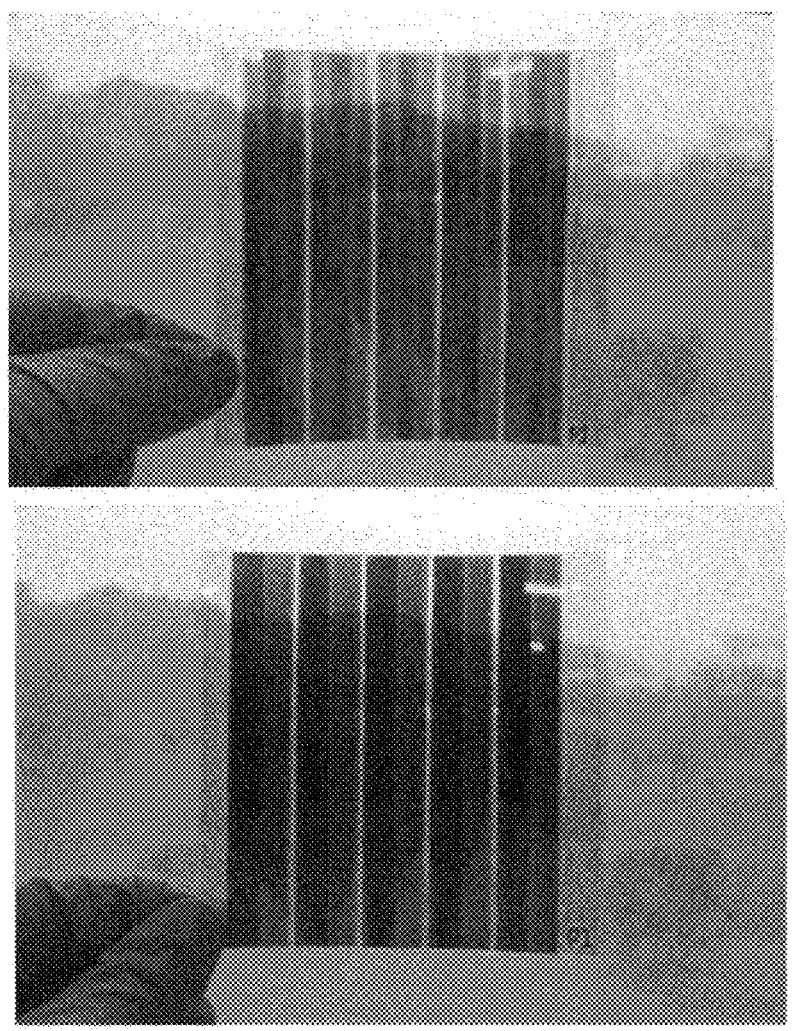

[Figure 7]
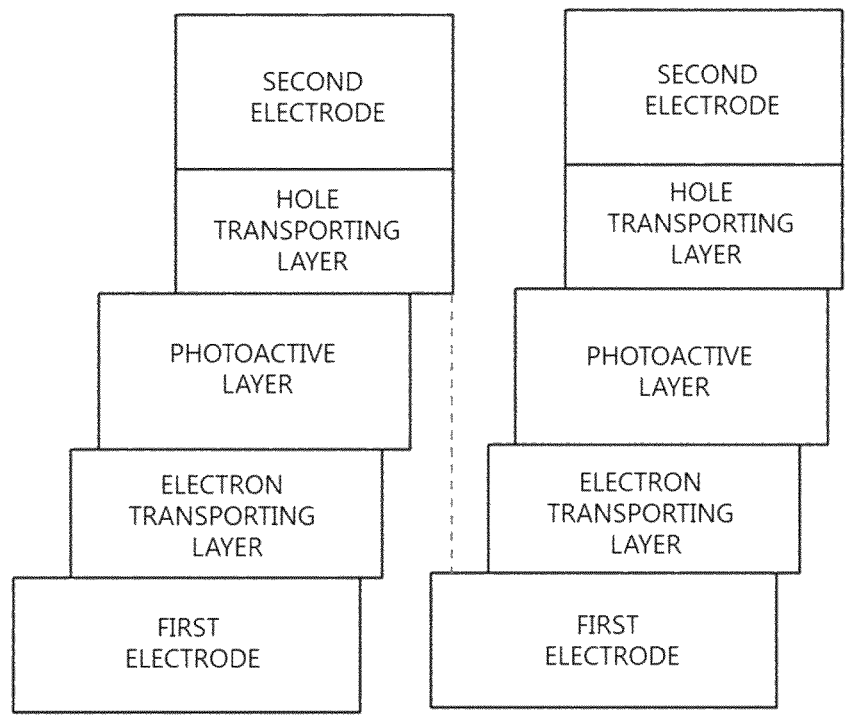

[Figure 8]
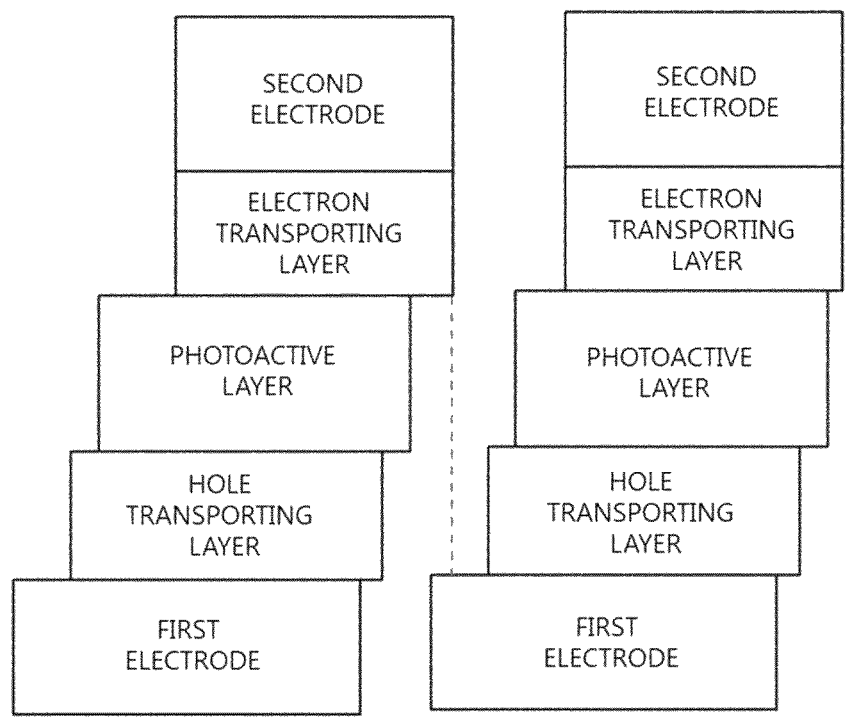

ORGANIC SOLAR CELL AND MANUFACTURING METHOD THEREFOR

TECHNICAL FIELD

This application is a National Stage Application of International Application No. PCT/KR2016/014183 filed on Dec. 5, 2016, which claims priority to and the benefit of Korean Patent Application Nos. 10-2015-0173537 and 10-2016-0163556 filed in the Korean Intellectual Property Office on Dec. 7, 2015 and Dec. 2, 2016, respectively, all of which are incorporated herein in their entirety by reference for all purposes as if fully set forth herein.

The present application relates to an organic solar cell and a method for manufacturing the same.

BACKGROUND ART

An organic solar cell is a device which may directly convert solar energy into electric energy by applying a photovoltaic effect. A solar cell may be divided into an inorganic solar cell and an organic solar cell, depending on the materials constituting a thin film. Typical solar cells are made through a p-n junction by doping crystalline silicon (Si), which is an inorganic semiconductor. Electrons and holes generated by absorbing light diffuse to p-n junction points and move to an electrode while being accelerated by the electric field. The power conversion efficiency in this process is defined as a ratio of electric power given to an external circuit and solar power entering the solar cell, and the power conversion efficiency has reached approximately 24% when measured under a currently standardized virtual solar irradiation condition. However, since inorganic solar cells in the related art have already shown the limitation in economic feasibility and material demands and supplies, an organic semiconductor solar cell, which is easily processed and inexpensive and has various functionalities, has come into the spotlight as a long-term alternative energy source.

Therefore, there is a need for studies on a development of a material capable of being used in an organic solar cell and various utilization of the organic solar cell.

DETAILED DESCRIPTION OF THE INVENTION

Technical Problem

The present application has been made in an effort to utilize an organic solar cell for various uses by designing the organic solar cell so as to display various colors.

Technical Solution

An exemplary embodiment of the present application provides an organic solar cell including: a first electrode; a second electrode which is disposed to face the first electrode; and an organic material layer having one or more layers which includes a photoactive layer disposed between the first electrode and the second electrode, in which one or more layers of the organic material layer include two or more regions having different thicknesses.

According to another exemplary embodiment of the present application, the two or more regions having different thicknesses are formed of the same material.

According to still another exemplary embodiment of the present application, the two or more regions having different thicknesses are different from each other in terms of at least one of the constituent materials.

According to yet another exemplary embodiment of the present application, the two or more regions having different thicknesses have different absorbances in at least a portion of visible rays.

Still yet another exemplary embodiment of the present application provides a method for manufacturing an organic solar cell, which includes a first electrode; a second electrode which is disposed to face the first electrode; and an organic material layer having one or more layers which includes a photoactive layer disposed between the first electrode and the second electrode, in which one or more layers of the organic material layer are formed so as to include two or more regions having different thicknesses by a coating method.

According to a further exemplary embodiment of the present application, the coating method is spray coating.

Advantageous Effects

According to exemplary embodiments described in the present application, two or more colors may be expressed in the same layer by changing a thickness of an organic material layer while using a material for the organic material layer required for driving an organic solar cell, and accordingly, the appearance of the organic solar cell may be visually improved by expressing letters or patterns to be expressed. Accordingly, it is possible to not only provide an effect of storing energy by the organic solar cell itself, but also disclose required information or provide visual beauty. Further, accordingly, it is possible to dispose an organic solar cell at more various spaces or positions as compared to an opaque organic solar cell.

BRIEF DESCRIPTION OF DRAWINGS

FIG. 1 is an appearance photograph of an organic solar cell manufactured in Example 1.

FIG. 2 is a graph illustrating absorbance in each region of the organic solar cell manufactured in Example 1.

FIG. 3 is an appearance photograph of an organic solar cell manufactured in Example 2.

FIG. 4 is a graph illustrating absorbance in each region of an organic solar cell manufactured in Example 3.

FIGS. 5 and 6 are examples of the colors capable of being expressed by organic solar cells according to exemplary embodiments of the present application.

FIG. 7 exemplifies a stacking structure of an organic solar cell module manufactured in the Example.

FIG. 8 exemplifies a stacking structure of an organic solar cell module according to an exemplary embodiment of the present application.

BEST MODE

Hereinafter, the present invention will be described in detail.

An organic solar cell according to an exemplary embodiment of the present application includes: a first electrode; a second electrode which is disposed to face the first electrode; and an organic material layer having one or more layers which includes a photoactive layer disposed between the first electrode and the second electrode, in which one or more layers of the organic material layer include two or more regions having different thicknesses.

In an organic solar cell in the related art, a region provided with a photoactive layer typically has a dark color close to black. However, the present inventors found that when among organic materials which may be used as a material for an organic material layer of an organic solar cell, a thickness of the organic material layer is adjusted, the organic material layer has a specific absorbance for the wavelength in a visible light region, thereby displaying a specific color. Therefore, it is possible to provide an organic solar cell which may express two or more colors by forming at least one organic material layer so as to include two or more regions having different thicknesses. Further, by forming the two or more regions so as to display letters or patterns, it is possible to display information or provide visual beauty through the letters or patterns while functioning as an organic solar cell itself, as illustrated in FIGS. 5 and 6.

The difference in thickness may be determined by the absorbance of visible rays to be divided by the difference, that is, the color. According to another exemplary embodiment of the present application, an organic material layer including two or more regions having different thicknesses may have a thickness of 30 nm to 600 nm.

For example, when the organic material layer includes a first region and a second region, which have different thicknesses, the first region and the second region may each have a thickness of 30 nm to 600 nm.

According to an exemplary embodiment of the present specification, a difference in thickness between the two or more regions having different thicknesses may be 10 nm to 570 nm. The difference in thickness may be measured by a method for measuring a thickness by means of an α-step apparatus or an SEM photograph, and the like.

In an exemplary embodiment of the present application, one or more layers of the organic material layer include two or more regions having different thicknesses.

According to another exemplary embodiment of the present application, one or more layers of the organic material layer may include three or more regions having different thicknesses.

According to still another exemplary embodiment of the present application, one or more layers of the organic material layer may include four or more regions having different thicknesses.

According to yet another exemplary embodiment of the present application, materials constituting the two or more regions having different thicknesses may be the same as each other. Even when the two or more regions are formed of the same material, different colors may be displayed by making the thicknesses different.

According to yet another exemplary embodiment of the present application, the two or more regions having different thicknesses may be different from each other in terms of at least one of the constituent materials. According to an example, thicknesses required may be different from each other in order to display a desired color according to the kind of material, so that the two or more regions are different from each other in terms of at least one of the constituent materials, and the thicknesses of the layers are different from each other.

In the organic material layer including the two or more regions having different thicknesses, spray coating to be described below may be repeated one time or two times or more in order to obtain a color to be expressed, in other words, a desired visible ray transmittance, by adjusting the thickness in each region. A thick layer may be formed by repeating the spray coating one time or two times or more.

According to still yet another exemplary embodiment of the present application, the two or more regions having different thicknesses have different absorbances in at least a portion of visible rays. By including two or more regions having different absorbances as described above, an organic solar cell may display two or more colors. The color, which may be expressed by the organic solar cell, may be determined by a material for an organic material layer, a thickness of an organic material layer, a transparency of an electrode, and the like.

According to a further exemplary embodiment of the present application, the organic material layer including the two or more regions having different thicknesses is a photoactive layer.

According to another further exemplary embodiment of the present application, the photoactive layer may include an electron donor material and an electron acceptor material.

The electron donor material may be selected from materials which serve as an electron donor according to a color to be displayed in an organic solar cell. The electron donor material may be selected from materials which do not absorb at least a portion of a visible ray region by adjusting the thickness and thus show a specific color.

According to still another further exemplary embodiment of the present application, the electron donor material may be at least one of the following Chemical Formulae 1-1 to 1-6.

[Chemical Formula 1-1]

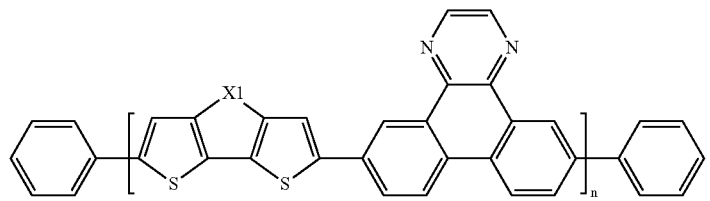

[Chemical Formula 1-2]
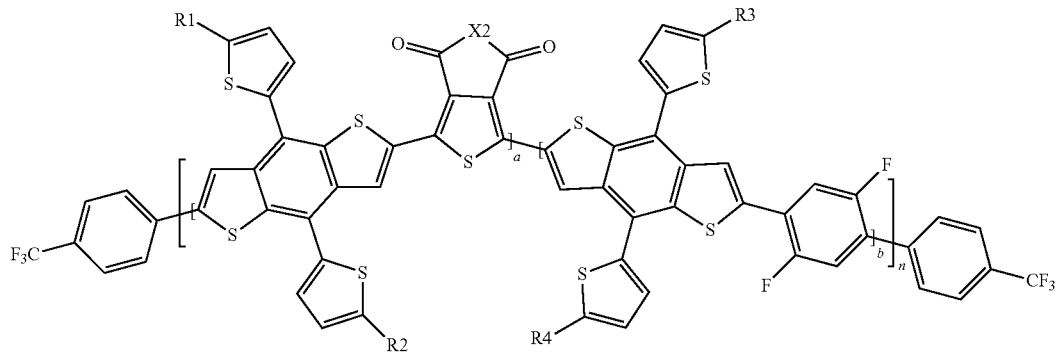
[Chemical Formula 1-3]
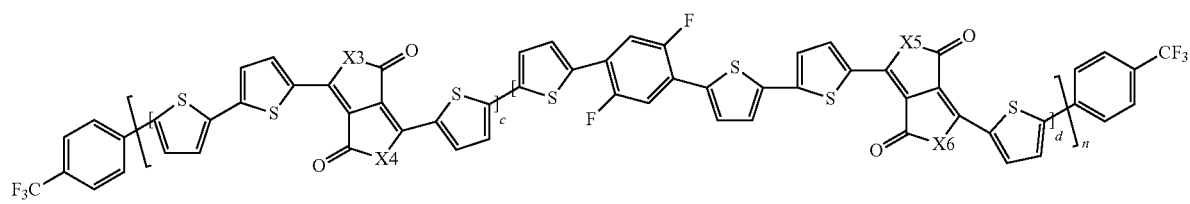
[Chemical Formula 1-4]
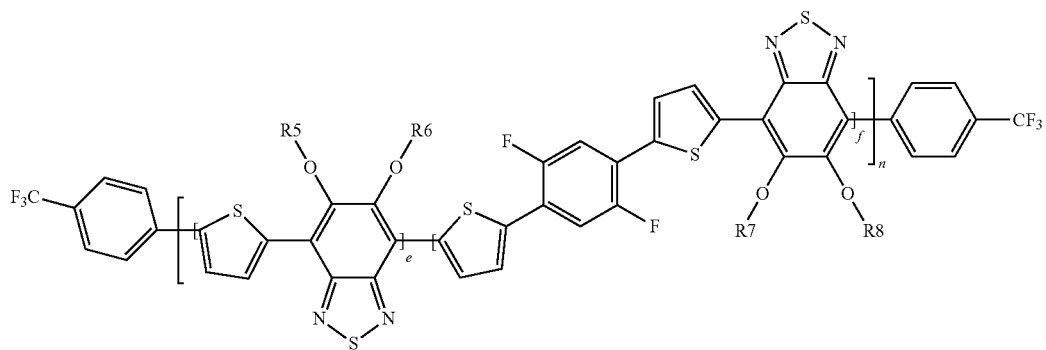
[Chemical Formula 1-5]
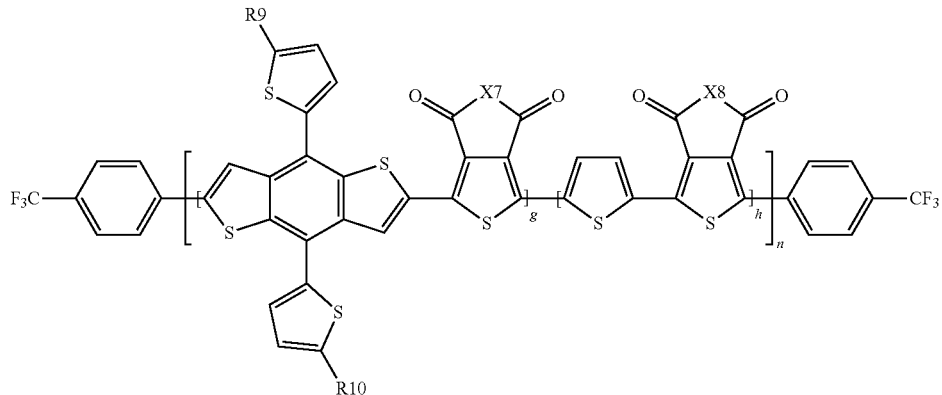
[Chemical Formula 1-6]
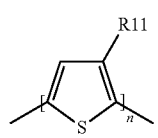

In Chemical Formulae 1-1 to 1-6,

X1 to X8 are the same as or different from each other, and are each independently SiRR' or NR, R, R', and R1 to R11 are the same as or different from each other, and are each independently an alkyl group, a, b, c, d, e, f, g, and h are the same as or different from each other, and are each independently a real number from 0 to 1, $a+b=1$, $c+d=1$, $e+f=1$, $g+h=1$, and n is an integer from 1 to 10,000.

According to yet another further exemplary embodiment of the present application, materials in the following Table 1 may be used as the electron donor material, but the electron donor material is not limited thereto.

TABLE 1

| | Structure | Color (MAX Wavelength) |
|---|---|---|
| Polymer A | 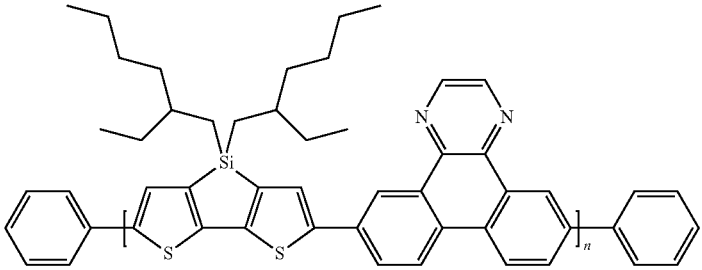 (Mn: 1,000 to 100,000) | Orange ($\lambda_{max}$: 487 nm) |
| Polymer B | 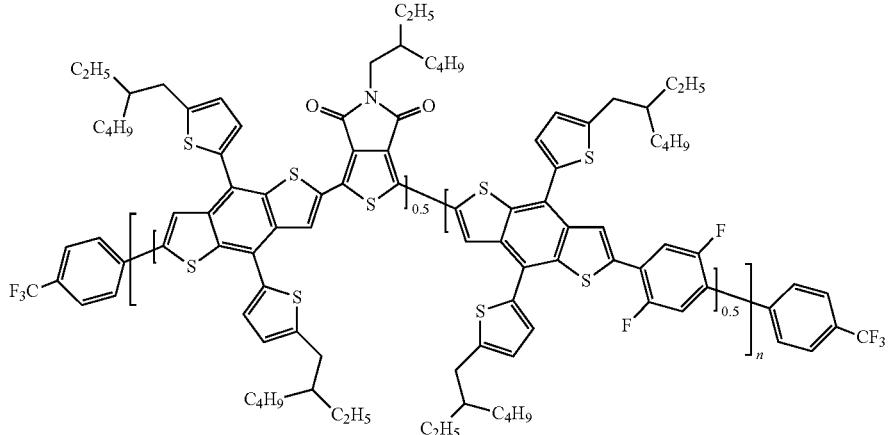 (Mn: 69,280) | Red ($\lambda_{max}$: 531 nm) |
| Polymer C | 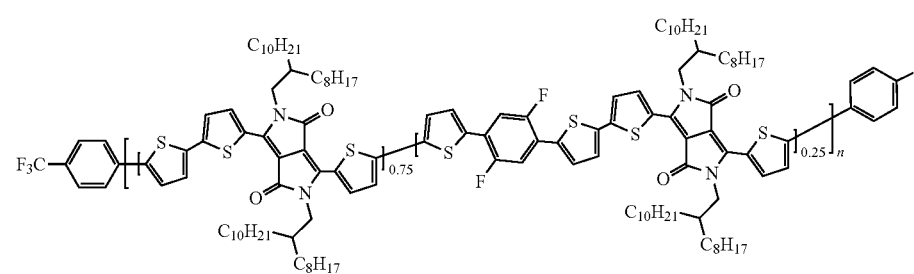 (Mn: 44,612) | Green ($\lambda_{max}$: 744 nm) |

TABLE 1-continued

| | Structure | Color (MAX Wavelength) |
|---|---|---|
| Polymer D | 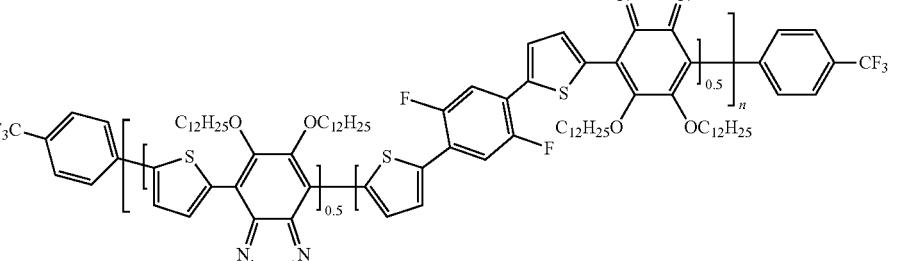<br>(Mn: 21,315) | Violet ($\lambda_{max}$: 591 nm) |
| Polymer E | 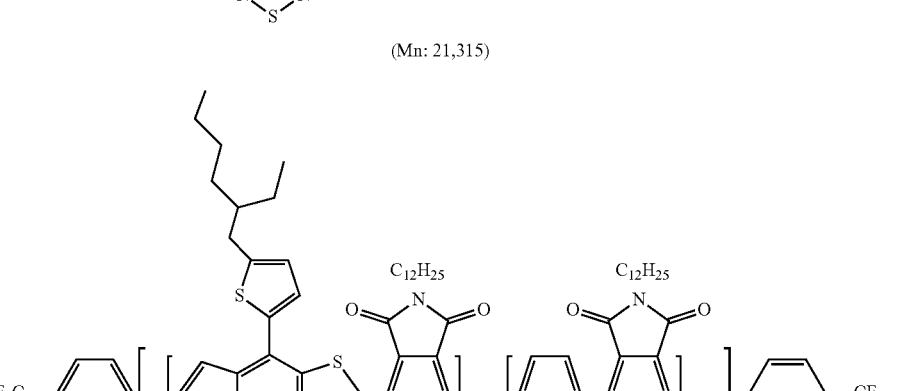<br>(Mn: 32,400) | Dark blue ($\lambda_{max}$: 628 nm) |
| Polymer F | 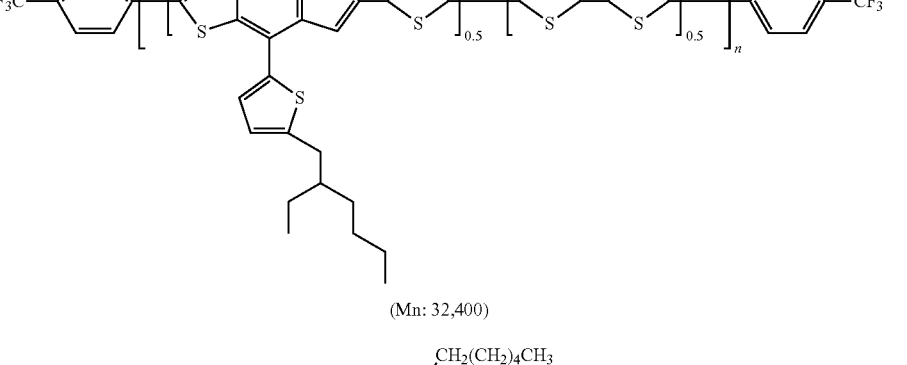<br>(Rieke, cat# 4002-EE, P3HT) | Red ($\lambda_{max}$: 525 nm) |

Table 1 describes a color which may be expressed from the materials, but the color may be adjusted according to a thickness of a layer composed of the materials.

As the electron acceptor material, it is possible to use those selected from the group consisting of fluorene, fluorene derivatives, bathocuproine, semiconducting elements, semiconducting compounds, and combinations thereof, but the electron acceptor material is not limited thereto. Specifically, as the electron acceptor material, it is possible to use one or two or more compounds selected from the group consisting of fullerene, fullerene derivatives (((6,6)-phenyl-$C_{61}$-butyric acid-methylester (PCBM) or (6,6)-phenyl-$C_{61}$-butyric acid-cholesteryl ester (PCBCR)), perylene, polybenzimidazole (PBI), and 3,4,9,10-perylene-tetracarboxylic bis-benzimidazole (PTCBI).

According to still yet another further exemplary embodiment of the present application, the photoactive layer has an absorbance of 2 or less in at least a portion of a visible ray region. For example, when the photoactive layer including the electron donor material and the electron acceptor material has a thickness of 30 nm to 600 nm, the photoactive layer may have an absorbance of 2 or less in at least a portion of a visible ray region.

In an exemplary embodiment of the present application, the first electrode is an anode, and the second electrode is a cathode. In another exemplary embodiment, the first electrode is a cathode, and the second electrode is an anode. The organic solar cells according to exemplary embodiments of the present specification may further include a substrate which is brought into contact with an anode side or a cathode side.

In an exemplary embodiment of the present application, in the organic solar cell, a cathode, a photoactive layer, and an anode may be arranged in this order, and an anode, a photoactive layer, and a cathode may be arranged in this order, but the arrangement order is not limited thereto.

According to another exemplary embodiment of the present application, a hole transporting layer may be further included between the photoactive layer and the anode. Further, an electron transporting layer may be further included between the photoactive layer and the cathode. For example, in the organic solar cell, an anode, a hole transporting layer, a photoactive layer, an electron transporting layer, and a cathode may also be arranged in this order, and a cathode, an electron transporting layer, a photoactive layer, a hole transporting layer, and an anode may also be arranged in this order, but the arrangement order is not limited thereto.

In an exemplary embodiment of the present application, the organic solar cell has a normal structure. The normal structure may mean that an anode is formed on a substrate. Specifically, according to an exemplary embodiment of the present specification, when the organic solar cell has a normal structure, a first electrode to be formed on a substrate may be an anode.

In an exemplary embodiment of the present application, the organic solar cell has an inverted structure. The inverted structure may mean that a cathode is formed on a substrate. Specifically, according to an exemplary embodiment of the present specification, when the organic solar cell has an inverted structure, a first electrode to be formed on a substrate may be a cathode.

In an exemplary embodiment of the present application, the organic solar cell has a tandem or stack structure. In this case, the organic solar cell may include a photoactive layer including two or more layers. In the organic solar cell according to an exemplary embodiment of the present specification, a photoactive layer may have one layer or two or more layers.

In another exemplary embodiment of the present application, a buffer layer may be disposed between a photoactive layer and a hole transporting layer, or between a photoactive layer and an electron transporting layer. At this time, a hole injection layer may be further disposed between an anode and the hole transporting layer. Further, an electron injection layer may be further disposed between a cathode and the electron transporting layer.

In the present specification, the substrate may be a glass substrate or a transparent plastic substrate having excellent transparency, surface smoothness, ease of handling, and waterproofing properties, but is not limited thereto, and the substrate is not limited as long as the substrate is typically used in the organic solar cell. Specific examples thereof include glass, polyethylene terephthalate (PET), polyethylene naphthalate (PEN), polypropylene (PP), polyimide (PI), triacetyl cellulose (TAC), and the like, but are not limited thereto.

The anode electrode may be made of a material which is transparent and has excellent conductivity, but is not limited thereto. Examples thereof include: a metal such as vanadium, chromium, copper, zinc, and gold, or an alloy thereof; a metal oxide such as zinc oxide, indium oxide, indium tin oxide (ITO), and indium zinc oxide (IZO); a combination of a metal and an oxide, such as $ZnO:Al$ or $SnO_2:Sb$; a conductive polymer such as poly(3-methylthiophene), poly [3,4-(ethylene-1,2-dioxy)thiophene] (PEDT), polypyrrole, and polyaniline; and the like, but are not limited thereto.

The cathode electrode may be a metal having a low work function, but is not limited thereto. Specific examples thereof include: a metal such as magnesium, calcium, sodium, potassium, titanium, indium, yttrium, lithium, gadolinium, aluminum, silver, tin, and lead, or an alloy thereof; and a multi-layer structured material such as LiF/Al, $LiO_2$/Al, LiF/Fe, Al:Li, $Al:BaF_2$, and $Al:BaF_2:Ba$, but are not limited thereto.

Materials for the hole transporting layer and/or electron transporting layer serve to efficiently transfer electrons and holes, which are separated from a photoactive layer, to an electrode, and the materials are not particularly limited.

The material for the hole transporting layer may be poly(3,4-ethylenediocythiophene) doped with poly(styrenesulfonic acid) (PEDOT:PSS), molybdenum oxide ($MoO_x$), vanadium oxide ($V_2O_5$), nickel oxide (NiO), tungsten oxide ($WO_x$), and the like, but is not limited thereto.

The material for the electron transporting layer may be electron-extracting metal oxides, and specific examples thereof include: a metal complex of 8-hydroxyquinoline; a complex including $Alq_3$; a metal complex including Liq; LiF; Ca; titanium oxide ($TiO_x$); zinc oxide (ZnO); cesium carbonate ($Cs_2CO_3$); and the like, but are not limited thereto.

Still another exemplary embodiment of the present application provides a method for manufacturing an organic solar cell, which includes a first electrode; a second electrode which is disposed to face the first electrode; and an organic material layer having one or more layers which includes a photoactive layer disposed between the first electrode and the second electrode, in which one or more layers of the organic material layer are formed so as to include two or more regions having different thicknesses by a coating method.

According to yet another exemplary embodiment of the present application, the coating method is spray coating.

As an example, spray coating may be carried out sequentially in each region by using two or more masks manufactured so as to carry out the spray coating in each region having different thicknesses. The spray coating may be carried out by using a solution in which an organic material to form the layer is dissolved in an organic solvent. In order to adjust the thickness of the organic material layer, if necessary, the amount of spray sprayed may be adjusted, or the coating may be repeated one time or two times or more. A desired thickness is advantageously formed by repeating the coating one time or two times or more.

An electrode and an organic material layer may be formed by using methods and materials in the art, except for an organic material layer including the two or more regions having different thicknesses.

A method of forming the anode electrode is not particularly limited, but the anode electrode may be formed, for example, by being applied onto one surface of a substrate using a method such as sputtering, e-beam, thermal deposition, spin coating, screen printing, inkjet printing, doctor blade, or gravure printing, or by being coated in the form of a film.

When the anode electrode is formed on a substrate, the anode electrode may be subjected to processes of cleaning, removing moisture, and hydrophilic modification.

For example, a patterned ITO substrate is sequentially cleaned with a cleaning agent, acetone, and isopropyl alcohol (IPA), and then dried on a hot plate at 100 to 150° C. for 1 to 30 minutes, preferably at 120° C. for 10 minutes in order to remove moisture, and when the substrate is completely cleaned, the surface of the substrate is hydrophilically modified.

Through the surface modification as described above, a junction surface potential may be maintained at a level suitable for a surface potential of a photoactive layer. Further, during the modification, a polymer thin film may be easily formed on the anode electrode, and the quality of the thin film may also be improved.

Examples of a pre-treatment technology for an anode electrode include a) a surface oxidation method using a parallel plate-type discharge, b) a method of oxidizing a surface through ozone produced by using UV (ultraviolet) rays in a vacuum state, c) an oxidation method using oxygen radicals produced by plasma, and the like. One of the methods may be selected depending on the state of an anode electrode or a substrate. However, even though any method is used, it is preferred to commonly prevent oxygen from leaving from the surface of the anode electrode or the substrate, and maximally suppress moisture and organic materials from remaining. At this time, it is possible to maximize a substantial effect of the pre-treatment.

As a specific example, it is possible to use a method of oxidizing a surface through ozone produced by using UV. At this time, a patterned ITO substrate after being ultrasonically cleaned is baked on a hot plate and dried well, and then introduced into a chamber, and the patterned ITO substrate may be cleaned by ozone generated by reacting an oxygen gas with UV light by operating a UV lamp.

However, the surface modification method of the patterned ITO substrate in the present specification need not be particularly limited, and any method may be used as long as the method is a method of oxidizing a substrate.

The cathode electrode may be deposited and formed in a thermal evaporator showing a vacuum degree of $5 \times 10^{-7}$ torr or less, but the forming method is not limited only to this method.

An organic material layer such as a hole transporting layer, an electron transporting layer, and a photoactive layer may be formed by dissolving a material to form the layer in an organic solvent, and then applying the solution by a method such as bar coating, spin coating, dip coating, screen printing, spray coating, doctor blade, and brush painting, but the forming method is not limited thereto.

The organic solar cells according to exemplary embodiments of the present specification may display letters or patterns through two or more colors, and thus may be used for displaying specific information or design. For example, the organic solar cell may also be used for a use, such as a blind, a curtain, a glass window, a sheet paper, a sunroof, and a signboard, which have a function of an organic solar cell.

MODE FOR INVENTION

Hereinafter, the present invention will be exemplified through Examples. However, the following Examples are provided only to exemplify the present invention, but do not intend to limit the scope of the present invention.

EXAMPLE 1

In order to clean a surface of a patterned ITO glass or ITO PET substrate, an ultrasonic cleaning was performed each for 20 minutes by sequentially using a cleaning agent, acetone, and isopropyl alcohol (IPA), and then moisture was completely removed by drying the patterned ITO glass or ITO PET substrate. When the patterned ITO substrate was completely cleaned, the surface thereof was modified in a UVO cleaner for 15 minutes.

A solution including 2.5 wt % of ZnO nanoparticles (manufactured by Nanograde LLC) in IPA (isopropyl alcohol) was applied on the glass substrate provided with an ITO layer by using a bar coating method. For the bar coating, the solution was reciprocally coated at a speed of 20 mm/sec. Subsequently, an electron transporting layer was formed by performing a heat treatment in the air in an oven at 150° C. for 10 minutes.

Subsequently, a photoactive layer including Region 1 to Region 5 was formed on the electron transporting layer by clearly dissolving a solution including an electron donor material and an electron acceptor material in the following Table 2 in chlorobenzene (CB) at 80° C., and then spray-coating the solution at room temperature in the air. Region 2 or 3 showed different visible ray transmittance (different colors) using the same material by varying the concentration or number of coatings of the solution depending on the position.

TABLE 2

| | Electron donor material:Electron acceptor material | Concentration (% w/v) | Number of coatings | Thickness of photoactive layer (nm) |
|---|---|---|---|---|
| Region 1 | Polymer F:PCBM | 1.0 | 2 | 46 ± 6 |
| Region 2 | Polymer F:PCBM | 1.0<br>2.0 | 2<br>1 | 219 ± 3 |
| Region 3 | Polymer F:PCBM | 1.0<br>2.0 | 2<br>2 | 565 ± 40 |
| Region 4 | Polymer A:PCBM | 1.5 | 4 | 244 ± 46 |
| Region 5 | Polymer E:PCBM | 2.0 | 4 | 420 ± 32 |

Subsequently, as a hole transporting layer, an MoO$_3$ layer was deposited at a speed of 0.3 Å/s by means of a thermal evaporation method and formed to have a thickness of 10 nm.

An electrode having a thickness of 100 nm was formed by depositing Ag metal at a speed of 1 Å/s on the hole transporting layer by means of a thermal evaporation method, thereby manufacturing an organic solar cell module having a structure illustrated in FIG. 7.

An appearance photograph of the organic solar cell manufactured in Example 1 is illustrated in FIG. 1. The absorbance (absorbance of the ITO substrate/ZnO/the photoactive layer) of the organic solar cell in each region is illustrated in FIG. 2.

EXAMPLE 2

An experiment was performed in the same manner as in Example 1, except that a photoactive layer including Region 1 to Region 4 was formed on the electron transporting layer by clearly dissolving a solution including an electron donor material and an electron acceptor material in the following Table 3 in chlorobenzene (CB) at 80° C. in the air, and then spray-coating the solution at room temperature in the air.

TABLE 3

| | Electron donor material:Electron acceptor material | Concentration (% w/v) | Number of coatings | Thickness of photoactive layer (nm) |
|---|---|---|---|---|
| Region 1 | Polymer A:PCBM | 1.5 | 3 | 217 ± 34 |
| Region 2 | Polymer B:PCBM | 3.0 | 2 | 409 ± 20 |
| Region 3 | Polymer C:PCMB | 2.0 | 2 | 348 ± 11 |
| Region 4 | Polymer E:PCBM | 2.5 | 3 | 516 ± 6 |

An appearance photograph of the organic solar cell manufactured in Example 2 is illustrated in FIG. 3. The absorbance (absorbance of the ITO substrate/ZnO/the photoactive layer) of the organic solar cell in each region is illustrated in FIG. 4.

The invention claimed is:

1. An organic solar cell comprising:
a first electrode;
a second electrode which is disposed to face the first electrode; and
an organic material layer having one or more layers which includes a photoactive layer disposed between the first electrode and the second electrode,
wherein the one or more layers of the organic material layer include four or more regions having different thicknesses,
wherein the organic material layer including the four or more regions having different thicknesses has a thickness of 30 nm to 600 nm,
wherein the four or more regions having different thicknesses comprise regions with a difference in thicknesses of from 10 nm to 570 nm,
wherein the four or more regions having different thicknesses have different absorbances in at least a portion of visible rays,
wherein the four or more regions having different thicknesses display different colors,
wherein the organic material layer including the four or more regions having different thicknesses is the photoactive layer,
wherein the photoactive layer includes an electron donor material and an electron acceptor material,
wherein the electron donor material includes at least two of the following Chemical Formulae 1-1 to 1-5, and
wherein the Chemical Formulae 1-1 to 1-5 have an orange, red, green, violet, and dark blue color, respectively:

[Chemical Formula 1-1]

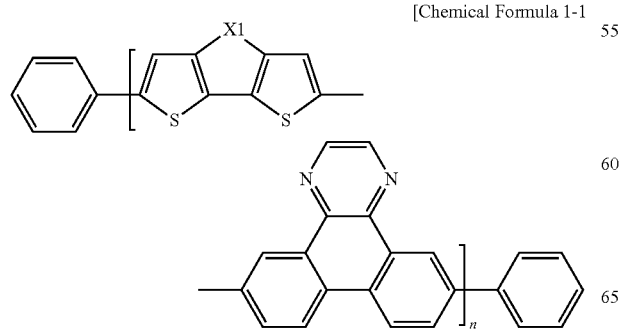

[Chemical Formula 1-2]

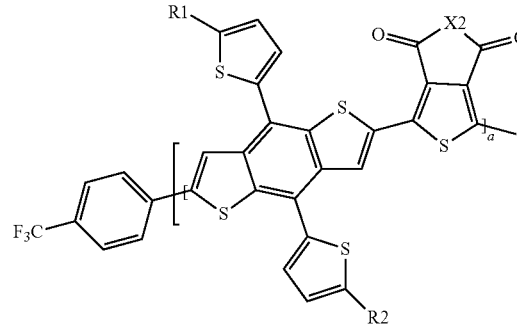

[Chemical Formula 1-3]

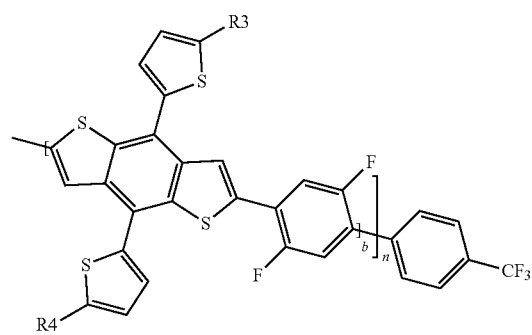

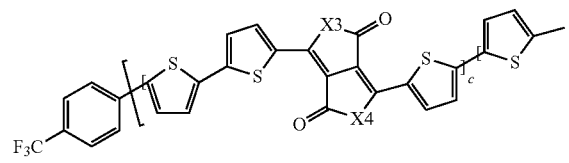

[Chemical Formula 1-4]

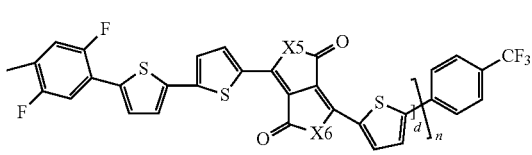

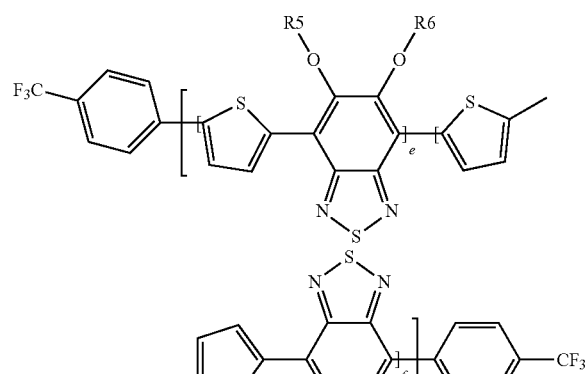

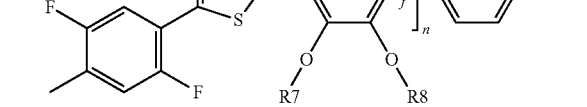

[Chemical Formula 1-5]

(structure shown)

wherein:
X1 to X8 are the same as or different from each other and are each independently SiRR' or NR;
R, R', and R1 to R10 are the same as or different from each other and are each independently an alkyl group;
a, b, c, d, e, f, g, and h are the same as or different from each other and are each independently a real number that is greater than 0 and less than 1;

$a+b=1;$ $c+d=1;$ $e+f=1;$ $g+h=1;$ and n is an integer from 1 to 10,000.

2. The organic solar cell of claim 1, wherein the four or more regions having different thicknesses are formed of the same material.

3. The organic solar cell of claim 1, wherein the four or more regions regions having different thicknesses are different from each other in terms of at least one of the constituent materials.

4. The organic solar cell of claim 1, wherein the photoactive layer has an absorbance of 2 or less in at least a portion of a visible ray region.

5. The organic solar cell of claim 1, wherein the organic solar cell has a tandem or stack structure.

6. A method for manufacturing the organic solar cell of claim 1,
comprising forming the one or more layers of the organic material layer so as to include the four or more regions having different thicknesses by a coating method.

7. The method for manufacturing the organic solar cell of claim 6, wherein the coating method is spray coating.

8. The method for manufacturing the organic solar cell of claim 6, wherein a spray coating is carried out two times or more in order to form at least one region in the four or more regions having different thicknesses.

9. The organic solar cell of claim 1, wherein the photoactive layer comprises at least two layers.

10. The organic solar cell of claim 1, wherein the electron donor material includes a compound of Chemical Formula 1-1:

[Chemical Formula 1-1]

(structure shown)

wherein X1 and n are as defined in claim 1.

11. The organic solar cell of claim 1, wherein the electron donor material includes a compound of Chemical Formula 1-2:

[Chemical Formula 1-2]

(structure shown)

wherein R1 to R4, X2, a, b and n are as defined in claim 1.

12. The organic solar cell of claim 1, wherein the electron donor material includes a compound of Chemical Formula 1-3:

[Chemical Formula 1-3]

(structure shown)

-continued

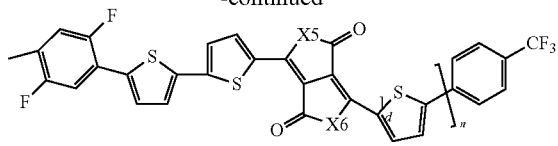

wherein X3 to X6, c, d and n are as defined in claim 1.

13. The organic solar cell of claim 1, wherein the electron donor material includes a compound of Chemical Formula 1-4:

[Chemical Formula 1-4]

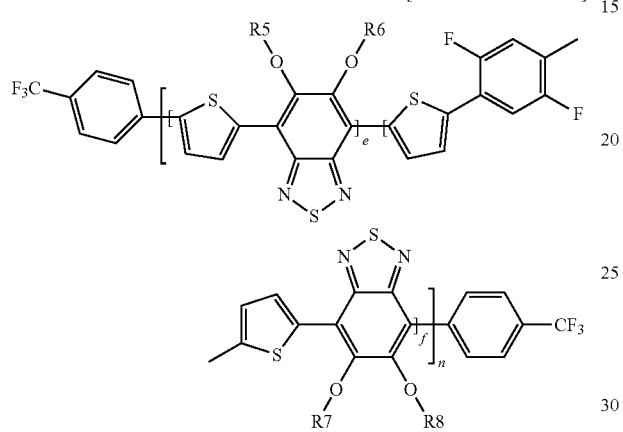

wherein R5 to R8, e, f and n are as defined in claim 1.

14. The organic solar cell of claim 1, wherein the electron donor material includes a compound of Chemical Formula 1-5:

[Chemical Formula 1-5]

wherein R9, R10, X7, X8, g, h and n are as defined in claim 1.

* * * * *

UNITED STATES PATENT AND TRADEMARK OFFICE
CERTIFICATE OF CORRECTION

PATENT NO. : 11,081,603 B2  
APPLICATION NO. : 15/736216  
DATED : August 3, 2021  
INVENTOR(S) : Jang et al.

Page 1 of 1

It is certified that error appears in the above-identified patent and that said Letters Patent is hereby corrected as shown below:

In the Claims

Column 15, Line 54, Claim 1: Please correct "[Chemical Formula 1-1" to read -- [Chemical Formula 1-1] --

Column 16, Line 2, Claim 1: Please correct "[Chemical Formula 1-2" to read -- [Chemical Formula 1-2] --

Column 17, Line 49, Claim 3: Please correct "more regions regions having" to read -- more regions having --

Column 19, Lines 1-6, Claim 12: Please delete the second half of Chemical Formula 1-3 and replace with the following:

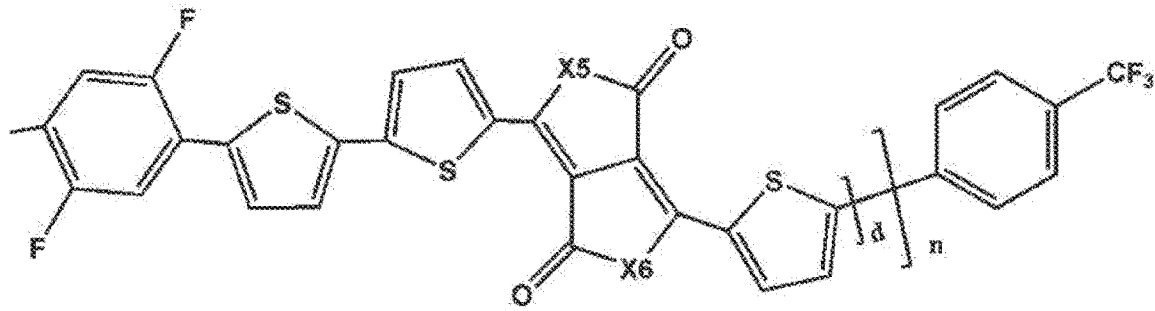

Signed and Sealed this  
Seventh Day of December, 2021

Drew Hirshfeld  
*Performing the Functions and Duties of the*  
*Under Secretary of Commerce for Intellectual Property and*  
*Director of the United States Patent and Trademark Office*